(12) United States Patent
Luan et al.

(10) Patent No.: US 6,670,889 B2
(45) Date of Patent: Dec. 30, 2003

(54) MECHANICAL TRANSMISSION SYSTEM FOR AUTOMATICALLY BREAKING OFF IN RESPONSE TO EARTHQUAKE AND METHOD THEREOF

(75) Inventors: Yi-Chang Luan, Hsinchu (TW); Tsun-Hu Chiu, Hsinchu (TW); Chu-Long Hsueh, Hsinchu (TW)

(73) Assignee: Winbond Electronics Corp., Hsinshu (TW)

( * ) Notice: Subject to any disclaimer, the term of this patent is extended or adjusted under 35 U.S.C. 154(b) by 35 days.

(21) Appl. No.: 10/162,453

(22) Filed: Jun. 4, 2002

(65) Prior Publication Data

US 2003/0122681 A1 Jul. 3, 2003

(30) Foreign Application Priority Data

Dec. 28, 2001 (TW) ........................................ 90132832 A

(51) Int. Cl.$^7$ .............................................. G08B 21/00
(52) U.S. Cl. ................. 340/690; 340/686.2; 340/686.5; 438/5
(58) Field of Search ............................. 340/690, 686.1, 340/687, 689, 686.2–686.6, 679, 601; 200/61.45 R, 61.52; 438/5

(56) References Cited

U.S. PATENT DOCUMENTS

| | | | | |
|---|---|---|---|---|
| 5,489,889 A | * | 2/1996 | Kambouris et al. | 340/540 |
| 6,134,850 A | * | 10/2000 | Hui et al. | 52/167.1 |
| 6,414,601 B1 | * | 7/2002 | Massedonio | 340/690 |
| 6,573,198 B2 | * | 6/2003 | Boonstra et al. | 438/795 |

* cited by examiner

Primary Examiner—Toan N Pham
(74) Attorney, Agent, or Firm—Volpe and Koenig, P.C.

(57) ABSTRACT

A mechanical transmission system for transmitting a wafer to a semiconductor manufacturing machine and being able to break off automatically in response to an earthquake via receiving a control signal generated by an earthquake detecting device is provided. The system includes a mechanical transmission device for transmitting the wafer to the semiconductor manufacturing machine, a warning device for generating a warning signal in response to the control signal, and a control circuit electrically coupling to the mechanical transmission device and breaking off in response to the control signal for avoiding the damage of the mechanical transmission device or the semiconductor-manufacturing machine caused by the earthquake.

19 Claims, 3 Drawing Sheets

MECHANICAL TRANSMISSION SYSTEM FOR AUTOMATICALLY BREAKING OFF IN RESPONSE TO EARTHQUAKE AND METHOD THEREOF

FIELD OF THE INVENTION

This invention relates to a mechanical transmission system for automatically breaking off and a method thereof, and more particularly to a mechanical transmission system, which is automatically breaking off in response to an earthquake.

BACKGROUND OF THE INVENTION

Currently, a semiconductor manufacturing apparatus employs a robot to put a plurality of wafers in a boat. A boat robot transmits a boat onto a thermal insulation tube of a tubular base and then again transmits a boat to the tubular for processing the semiconductor manufacturing steps.

Presently, all of construction of the semiconductor manufacturing apparatus is considered for avoiding or reducing the oscillation of the machine caused by an earthquake so as to reduce the manufacturing cost.

When there comes an earthquake, the displacement of the hardware structure inside the machine will appear. After the earthquake, the corresponding positions of the boat and the thermal insulation tube will be changed. But the boat robot of the tubular machine will remain unchanged to execute the action which is set in the original program. Thus if the earthquake occurs on the moment that the boat robot is travelling, the continuous actions of the robot will overturn and break the boat and the wafers thereon.

For dealing with the technical defects described above, the applicant keeps on carving unflaggingly to develop "mechanical transmission system for automatically breaking off in response to earthquake and method of the same" through wholehearted experience and research.

SUMMARY OF THE INVENTION

It is an object of the present invention to provide a mechanical transmission system for breaking off automatically in response to an earthquake and a method thereof.

It is another object of the present invention to provide a mechanical transmission system which can break off automatically to avoid the mechanical transmission device to be damaged due to the displacement of the hardware structure inside the system caused by an earthquake when the Richter scale of the earthquake reaches the preset value.

According to an aspect of the present invention, the mechanical transmission system for transmitting an article to a machine and being able to break off automatically in response to an earthquake via receiving a control signal generated by an earthquake detecting device includes a mechanical transmission device for transmitting the article to the machine, a warning device for generating a warning signal in response to the control signal, and a control circuit electrically coupling to the mechanical transmission device and breaking off in response to the control signal for avoiding the damage of the mechanical transmission device or the machine caused by the earthquake.

Preferably, the mechanical transmission device is a robot.

Preferably, the control circuit is a motor driver circuit of the mechanical transmission device.

Preferably, the warning device is a liquid crystal display (LCD).

Preferably, the warning device is a seven-segment display.

Preferably, the warning device is a buzzer.

Preferably, the warning device is a light emitting diode (LED).

Preferably, the mechanical transmission system includes an uninterruptible power supply (UPS).

Preferably, the mechanical transmission system further includes a signal check device for confirming whether the control signal is correct or not.

Preferably, the signal check device is constituted by a delayed circuit.

Preferably, the mechanical transmission system includes a restarting device for restarting the mechanical transmission device after the structure displacement of the machine is adjusted.

Preferably, the article is a wafer.

Preferably, the machine is a semiconductor apparatus.

Preferably, the earthquake detecting device is a seismograph.

In accordance with an aspect of the present invention, an automatically control system for transmitting an article to a machine includes an earthquake detecting device for detecting an earthquake and generating a control signal in response to the earthquake, and a mechanical transmission system electrically connected to the earthquake detecting device and breaking off in response to the control signal for avoiding the machine whose structure displacement is caused by an earthquake being damaged by the mechanical transmission system.

Preferably, the earthquake detecting device is a seismograph.

Preferably, the article is a wafer.

Preferably, the machine is a semiconductor apparatus.

In accordance with another aspect of the present invention, a method for automatically breaking off a mechanical transmission device in response to an earthquake is provided. The mechanical transmission device is electrically connected to an earthquake detecting device and includes a warning device and a control circuit for transmitting an article to a machine. The method includes steps of generating a control signal by the earthquake detecting device when an earthquake is detected, receiving the control signal by the warning device and generating a warning signal in response to the control signal, and breaking off the mechanical transmission device via the control circuit in response to the control signal for avoiding the machine whose structure displacement is caused by an earthquake to be damaged by the mechanical transmission device.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

Figure 1:
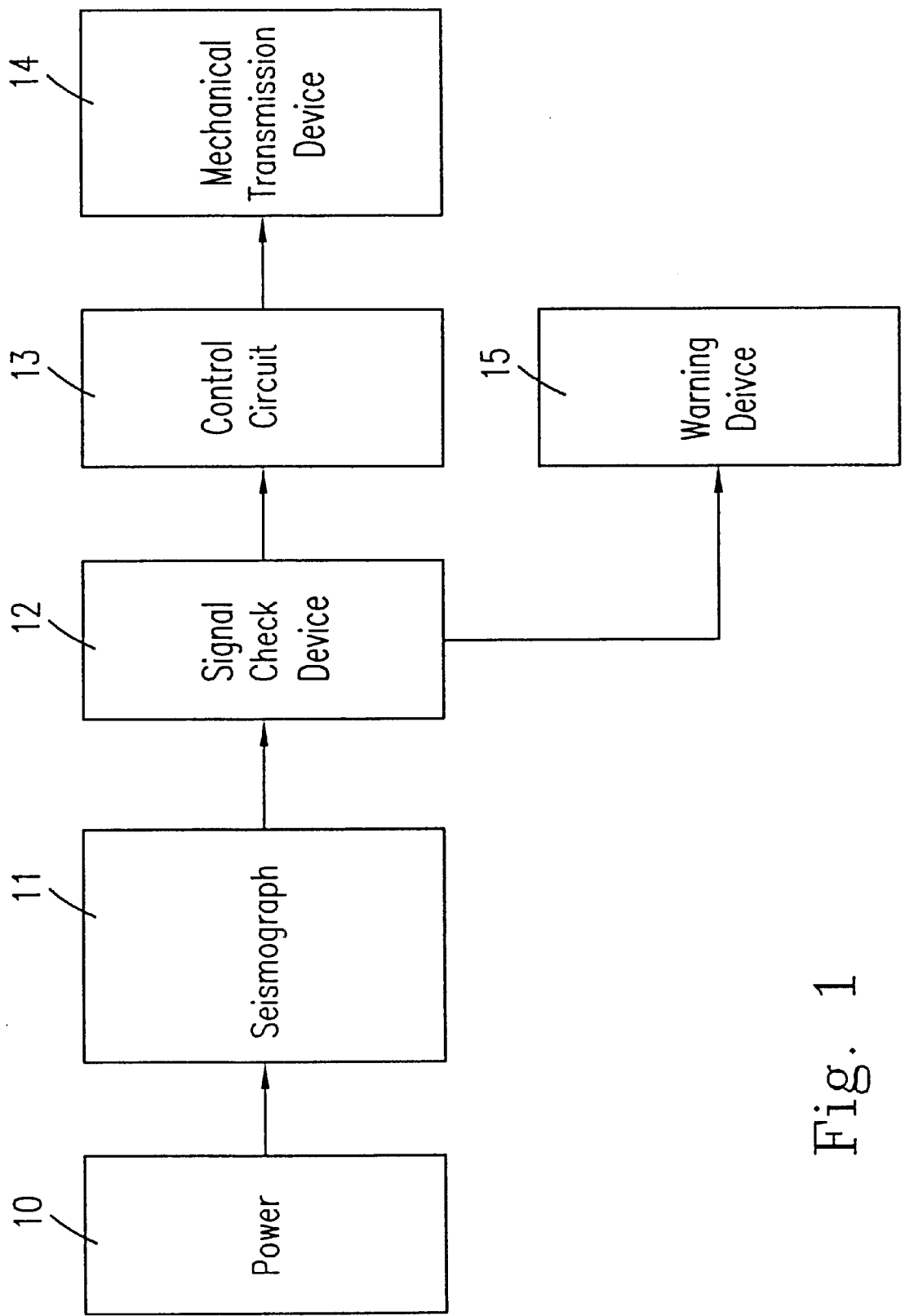
FIG. 1 shows a block diagram illustrating an automatically breaking off mechanical transmission system of the first preferred embodiment according to the present invention.

Please refer to FIG. 1. FIG. 1 shows the block diagram illustrating an automatically breaking off mechanical transmission system of the first preferred embodiment according to the present invention. This preferred embodiment could be applied to the mechanical transmission system which can transmit the wafers to the semiconductor-manufacturing machine. Regarding the mechanical transmission device 14 as a robot, the mechanical transmission system will be described in detail hereinafter according this preferred embodiment.

The mechanical transmission system can receive a control signal which is generated by a seismograph 11 when the preset earthquake intensity is achieved. And the robot 14 will automatically break off for avoiding the damage of the semiconductor-manufacturing machine whose structure is displaced by an earthquake. On the contrary, if the actions of the robot 14 are continued during or after the earthquake, the semiconductor-manufacturing machine will be damaged. The system includes a power 10, a signal check device 12, a control circuit 13, a robot 14, and a warning device 15.

The power 10 can be a main power of 110 volts which must be provided by an uninterruptible power supply. Also, the power 10 can be provided by the semiconductor-manufacturing machine.

The signal check device 12 can be a delayed circuit for confirming whether the control signal is truly generated by an earthquake or not. As to the delayed circuit, it can be constituted by the timekeeper. The judging method of the delayed circuit is to check whether the seismography 11 continuously outputs the control signal or not during a period of time. This is trying to make sure that the control signal from the seismograph 11 is truly generated by the earthquake and not influenced by the outer environment or the error action of the seismograph 11 itself.

The warning device 15 can be constituted by one selected from the group consisting of a liquid crystal display (LCD), a seven-segment display, a light emitting diode (LED), a buzzer, and a combination thereof. The warning device will generate a warning signal in response to the control signal to notify the locale engineers of the earthquake immediately.

The control circuit 13 can be a control circuit of the transmission motor inside the robot 14. Through the control signal, the control circuit 13 drives the breaking off circuit installed in the control circuit of the transmission motor to break off the robot 14. This action can avoid the semiconductor-manufacturing machine to be damaged. Otherwise, if the robot 14 of the machine still executes the action which is set in the original program, the semiconductor-manufacturing machine will be damaged due to the displacement of the structure therein.

Figure 2:
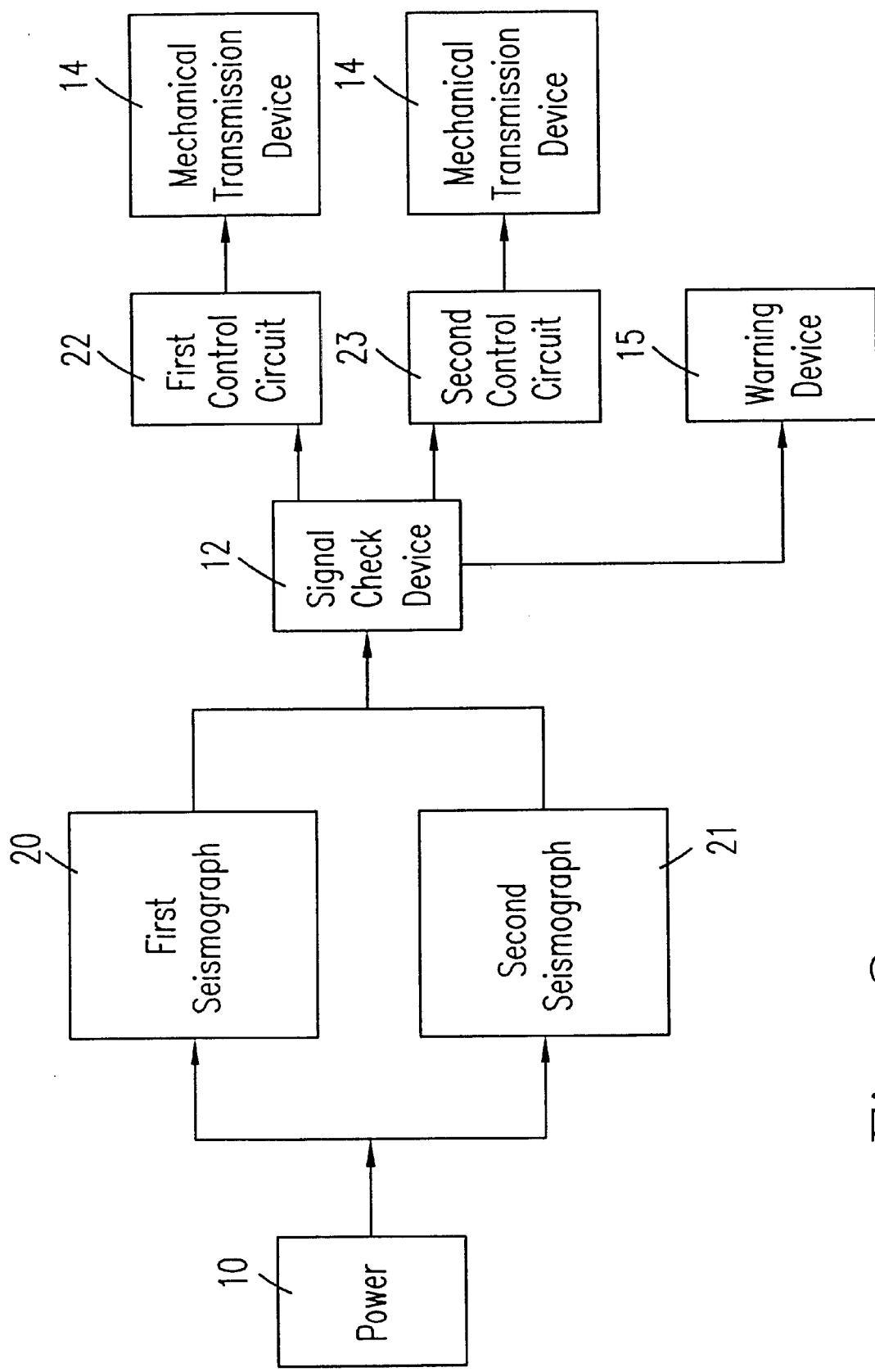
FIG. 2 shows a block diagram illustrating an automatically breaking off mechanical transmission system of the second preferred embodiment according to the present invention.

Please refer to FIG. 2. FIG. 2 shows the block diagram illustrating an automatically breaking off mechanical transmission system of the second preferred embodiment according to the present invention. The first preferred embodiment described above only uses a seismograph 11 to judge the occurrence of the earthquake. Thus the sequential control action will merely be in response to one degree of an earthquake intensity. However, the difference of this and the first preferred embodiments is that different structures inside the mechanical transmission device 14 can be separately controlled in response to different degrees of earthquake intensities. A first seismograph 20 and a second seismograph 21 are employed by this preferred embodiment.

When the Richter scale of an earthquake is greater than four but less than five, the first seismograph 20 will generate a control signal. The signal check device 12 will confirm whether the control signal is correct or not, thereby driving the first control circuit 22. And the first control circuit 22 will break off some structures inside the mechanical transmission device 14 with corresponding to the influence of this earthquake intensity.

When the Richter scale of an earthquake is greater than five, the first seismograph 20 and the second seismograph 21 will both generate control signals which will also be confirmed by the signal check device 12. And then the first control circuit 22 and the second control circuit 23 will break off some structures inside the mechanical transmission device 14 with corresponding to the influence of this earthquake intensity. Identically, the preferred embodiments according to the present invention can employ a plural of seismographs and preset different Richer scales in response to different earthquake intensities for controlling different part of the structures inside the mechanical transmission device.

Figure 3:
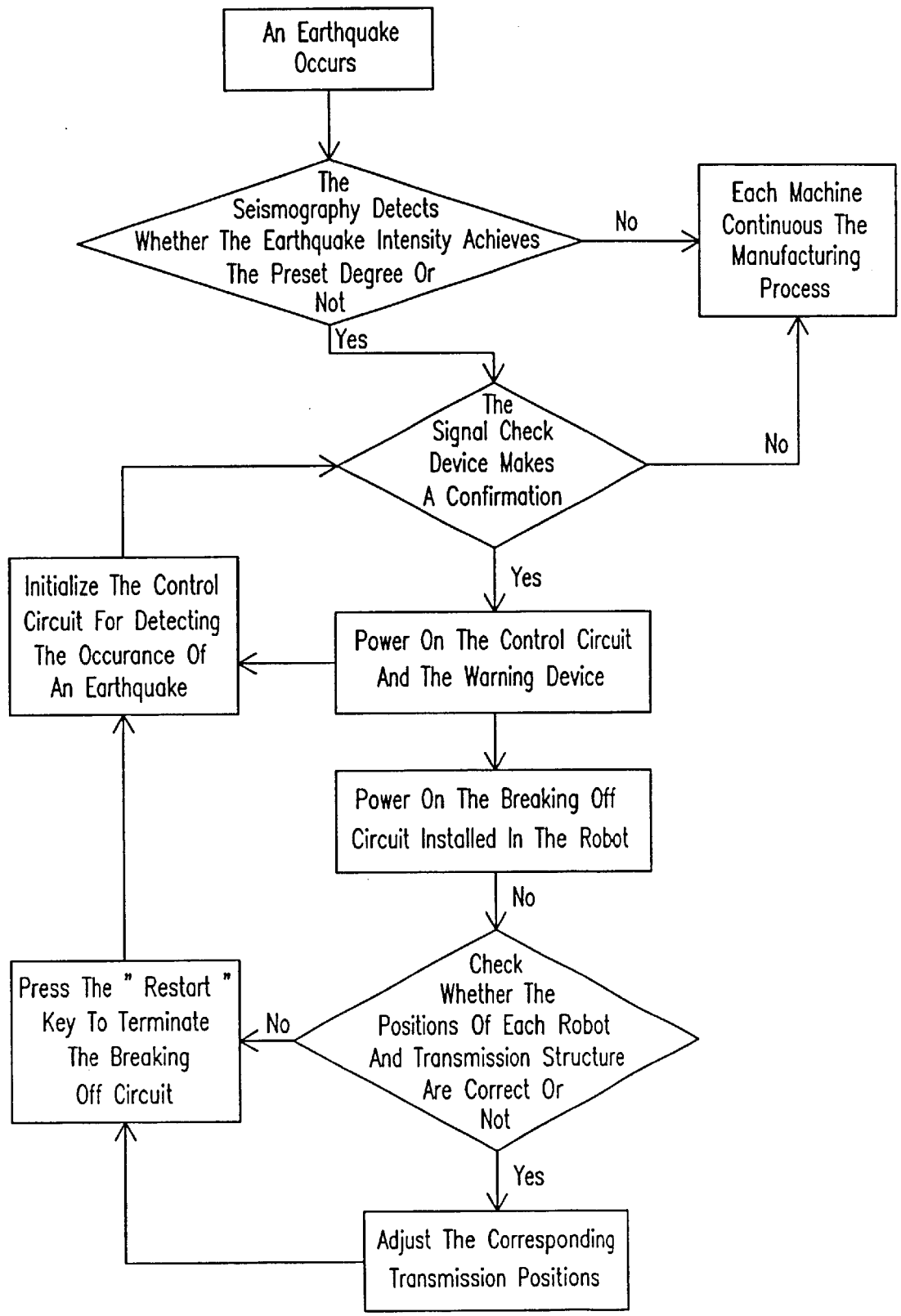
FIG. 3 shows a flowchart of the mechanical transmission system in response to an earthquake according to the present invention.

Please refer to FIG. 3. FIG. 3 shows the flowchart of the mechanical transmission system in response to an earthquake according to the present invention. When there comes an earthquake, FIG. 3 shows the steps which are trying to judge whether the scale of the earthquake achieves the preset level or not. If the earthquake intensity doesn't achieve the preset level, each machine will continuously execute the manufacturing steps set in the original program. On the contrary, if the control signal generated by the seismograph is confirmed by the signal check device, the control circuit will drive the breaking-off circuit and the warning device of the robot to be actuated. The control circuit and the warning device, however, must be initialized for ensuring the second operation of the protecting circuit when another earthquake occurs. But, this action will not actuate the stopped robot 14 again. For restarting the stopped robot, after the engineers check that all the transmissions are under normal condition and then the "restart" key can be pressed down to restore the normal operation of the robot 14.

Consequently, the present invention can effectively solve the problem that the semiconductor-manufacturing machine will be probably destroyed by the robot set in executing the original program, if the semiconductor-manufacturing machine is displaced by the earthquake, so as to protect the expansive machines and wafers during the semiconductor manufacturing process. And also, the present invention is industrial valuable.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A mechanical transmission system for transmitting an article to a machine and being able to break off automatically in response to an earthquake via receiving a control signal generated by an earthquake detecting device, said system comprising:

a mechanical transmission device for transmitting said article to said machine;

a warning device for generating a warning signal in response to said control signal; and a control circuit electrically coupling to said mechanical transmission device and breaking off in response to said control signal for avoiding the damage of said mechanical transmission device or said machine caused by said earthquake.

2. A system according to claim 1 wherein said mechanical transmission device is a robot.

3. A system according to claim 1 wherein said control circuit is a motor driver circuit of said mechanical transmission device.

4. A system according to claim 1 wherein said warning device is a liquid crystal display (LCD).

5. A system according to claim 1 wherein said warning device is a seven-segment display.

6. A system according to claim 1 wherein said warning device is a buzzer.

7. A system according to claim 1 wherein said warning device is a light emitting diode (LED).

8. A system according to claim 1 wherein said mechanical transmission system comprises an uninterruptible power supply (UPS).

9. A system according to claim 1 further comprising a signal check device for confirming if said control signal is correct or not.

10. A system according to claim 9 wherein said signal check device is constituted by a delayed circuit.

11. A system according to claim 1 wherein said mechanical transmission system comprises a restarting device for restarting said mechanical transmission device after the structure displacement of said machine is adjusted.

12. A system according to claim 1 wherein said article is a wafer.

13. A system according to claim 1 wherein said machine is a semiconductor apparatus.

14. A system according to claim 1 wherein said earthquake detecting device is a seismograph.

15. An automatically control system for transmitting an article to a machine, comprising:

an earthquake detecting device for detecting an earthquake and generating a control signal in response to said earthquake; and a mechanical transmission system electrically connected to said earthquake detecting device and breaking off in response to said control signal for avoiding said machine whose structure displacement is caused by an earthquake to be damaged by said mechanical transmission system.

16. A system according to claim 15 wherein said earthquake detecting device is a seismograph.

17. A system according to claim 15 wherein said article is a wafer.

18. A system according to claim 15 wherein said machine is a semiconductor apparatus.

19. A method for automatically breaking off a mechanical transmission device in response to an earthquake, said mechanical transmission device being electrically connected to an earthquake detecting device and comprising a warning device and a control circuit for transmitting an article to a machine, and said method comprising steps of:

generating a control signal by said earthquake detecting device when an earthquake is detected;

receiving said control signal by said warning device and generating a warning signal in response to said control signal; and breaking off said mechanical transmission device via said control circuit in response to said control signal for avoiding said machine whose structure displacement is caused by an earthquake being damaged by said mechanical transmission device.

* * * * *